US008726125B1

(12) United States Patent
Jia

(10) Patent No.: US 8,726,125 B1
(45) Date of Patent: May 13, 2014

(54) REDUCING INTERPOLATION ERROR

(75) Inventor: Wei Jia, San Jose, CA (US)

(73) Assignee: Nvidia Corporation, Santa Clara, CA (US)

( * ) Notice: Subject to any disclaimer, the term of this patent is extended or adjusted under 35 U.S.C. 154(b) by 1667 days.

(21) Appl. No.: 11/810,744

(22) Filed: Jun. 6, 2007

(51) Int. Cl.
*H03M 13/00* (2006.01)

(52) U.S. Cl.
USPC .......................................................... 714/759

(58) Field of Classification Search
USPC ......... 714/745, 759, 763, 746, 785, 738, 799, 714/747, 819, 736, 737; 375/243, 245, 375/240.03, 240.12, 240.27
See application file for complete search history.

(56) References Cited

U.S. PATENT DOCUMENTS 5,163,136 A 11/1992 Richmond
5,189,671 A 2/1993 Cheng
5,420,872 A * 5/1995 Hyodo et al. ................. 714/747
5,774,206 A 6/1998 Wasserman et al.
5,796,743 A 8/1998 Bunting et al.
5,821,886 A 10/1998 Son
6,008,745 A 12/1999 Zandi et al.
6,023,088 A 2/2000 Son
6,041,403 A 3/2000 Parker et al.
6,041,431 A * 3/2000 Goldstein ..................... 714/784
6,047,253 A * 4/2000 Nishiguchi et al. ........... 704/207
6,047,357 A 4/2000 Bannon et al.
6,144,322 A 11/2000 Sato
6,157,741 A * 12/2000 Abe et al. ...................... 382/233
6,161,531 A * 12/2000 Hamburg et al. ............. 123/674
6,298,370 B1 10/2001 Tang et al.
6,339,658 B1 1/2002 Moccagatta et al.
6,462,744 B1 10/2002 Mochida et al.
6,480,489 B1 11/2002 Muller et al.
6,543,023 B2 4/2003 Bessios
6,552,673 B2 4/2003 Webb
6,563,440 B1 5/2003 Kangas
6,563,441 B1 5/2003 Gold
6,577,681 B1 6/2003 Kimura
6,654,539 B1 11/2003 Duruoz et al.
6,675,282 B2 1/2004 Hum et al.
6,718,507 B1 * 4/2004 Johnston et al. .............. 714/776
6,795,503 B2 9/2004 Nakao et al.
6,839,624 B1 1/2005 Beesley et al.
6,981,073 B2 12/2005 Wang et al.
7,016,547 B1 3/2006 Smirnov
7,051,123 B1 5/2006 Baker et al.
7,068,407 B2 6/2006 Sakai et al.
7,068,919 B2 6/2006 Ando et al.
7,069,407 B1 6/2006 Vasudevan et al.
7,074,153 B2 7/2006 Usoro et al.
7,113,546 B1 9/2006 Kovacevic et al.
7,119,813 B1 10/2006 Hollis et al.
7,158,539 B2 1/2007 Zhang et al.
7,209,636 B2 4/2007 Imahashi et al.
7,230,986 B2 6/2007 Wise et al.
7,248,740 B2 7/2007 Sullivan
7,286,543 B2 10/2007 Bass et al.
7,324,026 B2 1/2008 Puri et al.
7,327,378 B2 2/2008 Han et al.
7,606,313 B2 10/2009 Raman et al.

(Continued)

*Primary Examiner* — Phung M Chung

(57) ABSTRACT

An approach to reducing interpolation error is described. This approach generally involves using an offset correction table, populated with predetermined offset correction values, to reduce the error introduced by linear interpolation. This approach includes calculating an approximate inverse quantized value. The offset correction table is accessed, and a corrected inverse quantized value is then calculated.

20 Claims, 14 Drawing Sheets

Flowchart 900

(56) References Cited

U.S. PATENT DOCUMENTS

| | | | |
|---|---|---|---|
| 7,627,042 B2 | 12/2009 | Raman et al. | |
| 7,724,827 B2 | 5/2010 | Liang et al. | |
| 7,765,320 B2 | 7/2010 | Vehse et al. | |
| 7,812,927 B2 * | 10/2010 | Kurosawa | 355/53 |
| 8,032,367 B2 * | 10/2011 | Takamizawa | 704/229 |
| 2001/0010755 A1 | 8/2001 | Ando et al. | |
| 2001/0026585 A1 | 10/2001 | Kumaki | |
| 2002/0094031 A1 | 7/2002 | Ngai et al. | |
| 2003/0043919 A1 | 3/2003 | Haddad | |
| 2003/0156652 A1 | 8/2003 | Wise et al. | |
| 2003/0179706 A1 | 9/2003 | Goetzinger et al. | |
| 2003/0196040 A1 | 10/2003 | Hosogi et al. | |
| 2004/0028142 A1 | 2/2004 | Kim | |
| 2004/0056787 A1 | 3/2004 | Bossen | |
| 2004/0059770 A1 | 3/2004 | Bossen | |
| 2004/0067043 A1 | 4/2004 | Duruoz et al. | |
| 2004/0081245 A1 | 4/2004 | Deeley et al. | |
| 2004/0096002 A1 | 5/2004 | Zdepski et al. | |
| 2004/0109059 A1 * | 6/2004 | Kawakita | 348/143 |
| 2004/0130553 A1 | 7/2004 | Ushida et al. | |
| 2004/0145677 A1 | 7/2004 | Raman et al. | |
| 2005/0008331 A1 | 1/2005 | Nishimura et al. | |
| 2005/0123274 A1 | 6/2005 | Crinon et al. | |
| 2005/0182778 A1 | 8/2005 | Heuer et al. | |
| 2005/0207497 A1 | 9/2005 | Rovati et al. | |
| 2006/0013321 A1 | 1/2006 | Sekiguchi et al. | |
| 2006/0083306 A1 | 4/2006 | Hsu | |
| 2006/0215916 A1 * | 9/2006 | Kimura | 382/233 |
| 2006/0256120 A1 | 11/2006 | Ushida et al. | |
| 2007/0006060 A1 | 1/2007 | Walker | |
| 2007/0041653 A1 * | 2/2007 | Lafon | 382/250 |
| 2007/0288971 A1 | 12/2007 | Cragun et al. | |
| 2008/0317138 A1 | 12/2008 | Jia | |

* cited by examiner

Graph 200

Graph 250

Flowchart 300

System 302

Graph 400

Graph 450

Flowchart 500

Flowchart 600

Flowchart 700

Graph 800

Graph 850

Flowchart 900

System 1000

REDUCING INTERPOLATION ERROR

BACKGROUND

1. Field of the Invention

Embodiments of the present invention relate to reducing error caused by linear interpolation.

2. Related Art

A persistent issue in digital media is the balance between quality of a presentation, and the costs inherent in preserving quality. Many media standards specify that implementations of that standard must meet certain minimum quality requirements, without specifically limiting how the standard is to be implemented.

For example, both the MP3 and AAC audio formats specify the use of nonlinear inverse quantization during the decoding process, and the standard requires that errors introduced during this inverse quantization process fall within certain minimums. Two prevailing approaches have been adopted for these specific standards. In one approach, errors are minimized, but at the cost of substantial memory requirements for implementing the solution. In another approach, a degree of error is acceptable, which lowers the memory requirements significantly, but at an increased cost in hardware resources.

SUMMARY

Methods and systems for reducing interpolation error are described. One approach generally involves using an offset correction table, populated with predetermined offset correction values, to reduce the error introduced by interpolation. This approach includes calculating an approximate value. The offset correction table is accessed, and a corrected value is then calculated.

Another embodiment generally involves the creation of such an offset correction table. In this approach, a number of quantized values are examined. For each of these quantized values, an interpolated inverse quantization value is calculated. Also for each of these quantized values, a precise inverse quantization value is calculated. An offset table is generated, using the interpolated inverse quantization values and the precise inverse quantization values.

Another embodiment describes a system for calculating an inverse quantized value. The system includes a selection means, for selecting between a number of operations that can be performed on a quantized value. A performing means or module performs one selected operation on the quantized value. The system includes a lookup table for storing and retrieving interpolated values, and a calculation means for calculating an approximate inverse quantized value from a retrieved interpolated value. The system also includes an offset table for storing and retrieving interpolation error correction values. A correction means uses the approximate inverse quantized value and a retrieved interpolation error correction value to calculate the inverse quantized value.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Figure 1:
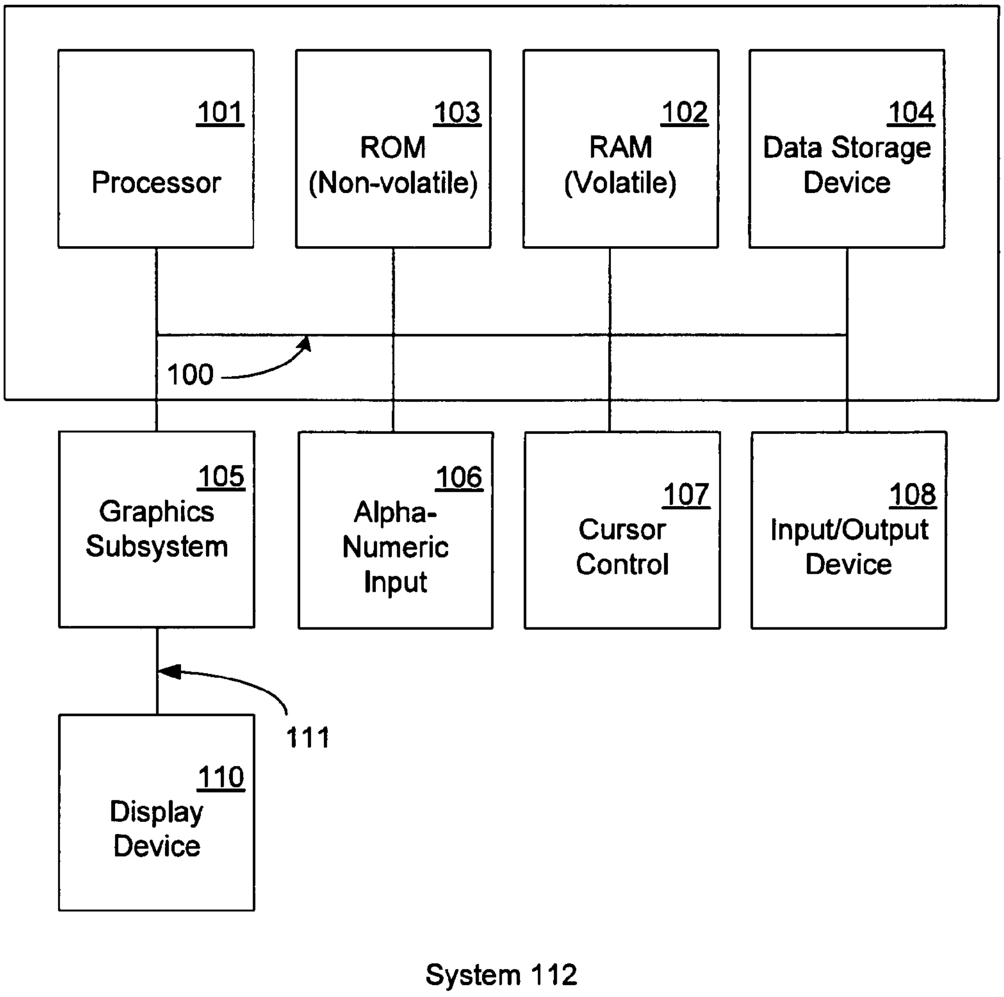
FIG. 1 is a block diagram of an exemplary computer system upon which embodiments of the present invention may be implemented.

Reference will now be made in detail to several embodiments of the invention. While the invention will be described in conjunction with the alternative embodiment(s), it will be understood that they are not intended to limit the invention to these embodiments. On the contrary, the invention is intended to cover alternative, modifications, and equivalents, which may be included within the spirit and scope of the invention as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follows are presented and discussed in terms of a method. Although steps and sequencing thereof are disclosed in figures herein (e.g., FIG. 5) describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "traversing," "associating," "identifying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Computing devices typically include at least some form of computer readable media. Computer readable media can be any available media that can be accessed by a computing device. By way of example, and not limitation, computer readable medium may comprise computer storage media and communication media. Computer storage media includes volatile and nonvolatile, removable and non-removable media implemented in any method or technology for storage of information such as computer readable instructions, data structures, program modules, or other data. Computer storage media includes, but is not limited to, RAM, ROM, EEPROM, flash memory or other memory technology, CD-ROM, digital versatile discs (DVD) or other optical storage, magnetic cassettes, magnetic tape, magnetic disk storage or other magnetic storage devices, or any other medium which can be used to store the desired information and which can be accessed by a computing device. Communication media typically embodies computer readable instructions, data structures, program modules, or other data in a modulated data signals such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above should also be included within the scope of computer readable media.

Some embodiments may be described in the general context of computer-executable instructions, such as program modules, executed by one or more computers or other devices. Generally, program modules include routines, programs, objects, components, data structures, etc., that perform particular tasks or implement particular abstract data types. Typically the functionality of the program modules may be combined or distributed as desired in various embodiments.

Although embodiments described herein may make reference to a CPU and a GPU as discrete components of a computer system, those skilled in the art will recognize that a CPU and a GPU can be integrated into a single device, and a CPU and GPU may share various resources such as instruction logic, buffers, functional units and so on; or separate resources may be provided for graphics and general-purpose operations. Accordingly, any or all of the circuits and/or functionality described herein as being associated with GPU could also be implemented in and performed by a suitably configured CPU.

Further, while embodiments described herein may make reference to a GPU, it is to be understood that the circuits and/or functionality described herein could also be implemented in other types of processors, such as general-purpose or other special-purpose coprocessors, or within a CPU.

Basic Computing System

Referring now to FIG. 1, a block diagram of an exemplary computer system 112 is shown. It is appreciated that computer system 112 described herein illustrates an exemplary configuration of an operational platform upon which embodiments may be implemented to advantage. Nevertheless, other computer systems with differing configurations can also be used in place of computer system 112 within the scope of the present invention. That is, computer system 112 can include elements other than those described in conjunction with FIG. 1. Moreover, embodiments may be practiced on any system which can be configured to enable it, not just computer systems like computer system 112. It is understood that embodiments can be practiced on many different types of computer system 112. System 112 can be implemented as, for example, a desktop computer system or server computer system having a powerful general-purpose CPU coupled to a dedicated graphics rendering GPU. In such an embodiment, components can be included that add peripheral buses, specialized audio/video components, IO devices, and the like. Similarly, system 112 can be implemented as a handheld device (e.g., cellphone, etc.) or a set-top video game console device such as, for example, the Xbox®, available from Microsoft Corporation of Redmond, Wash., or the PlayStation3®, available from Sony Computer Entertainment Corporation of Tokyo, Japan. System 112 can also be implemented as a "system on a chip", where the electronics (e.g., the components 101, 103, 105, 106, and the like) of a computing device are wholly contained within a single integrated circuit die. Examples include a hand-held instrument with a display, a car navigation system, a portable entertainment system, and the like.

Computer system 112 comprises an address/data bus 100 for communicating information, a central processor 101 coupled with bus 100 for processing information and instructions; a volatile memory unit 102 (e.g., random access memory [RAM], static RAM, dynamic RAM, etc.) coupled with bus 100 for storing information and instructions for central processor 101; and a non-volatile memory unit 103 (e.g., read only memory [ROM], programmable ROM, flash memory, etc.) coupled with bus 100 for storing static information and instructions for processor 101. Moreover, computer system 112 also comprises a data storage device 104 (e.g., hard disk drive) for storing information and instructions.

Computer system 112 also comprises an optional graphics subsystem 105, an optional alphanumeric input device 106, an optional cursor control or directing device 107, and signal communication interface (input/output device) 108. Optional alphanumeric input device 106 can communicate information and command selections to central processor 101. Optional cursor control or directing device 107 is coupled to bus 100 for communicating user input information and command selections to central processor 101. Signal communication interface (input/output device) 108, which is also coupled to bus 100, can be a serial port. Communication interface 108 may also include wireless communication mechanisms. Using communication interface 108, computer system 112 can be communicatively coupled to other computer systems over a communication network such as the Internet or an intranet (e.g., a local area network), or can receive data (e.g., a digital television signal). Computer system 112 may also comprise graphics subsystem 105 for presenting information to the computer user, e.g., by displaying information on an attached display device 110, connected by a video cable 111. In some embodiments, graphics subsystem 105 is incorporated into central processor 101. In other embodiments, graphics subsystem 105 is a separate, discrete component. In other embodiments, graphics subsystem 105 is incorporated into another component. In other embodiments, graphics subsystem 105 is included in system 112 in other ways.

Inverse Quantization

Inverse quantization (IQ) is used in many different digital media applications. In a number of these applications, e.g., AAC and MP3 decoding, a nonlinear inverse quantization is specified. For example, IQ in AAC and MP3 decoding is performed using the equation presented below, in Table 1. In this situation, x is the quantized integral value, and can range from 0 to 8207, inclusive.

TABLE 1

| |
|---|
| $IQ = x^{4/3}$ |

Two typical implementation schemes have been developed, to address nonlinear inverse quantization, such as that called for by the AAC and MP3 standards. The first such implementation uses a full-size lookup table for the entire possible range of values. In the case of AAC and MP3, where x may range from 0 to 8207, the lookup table has 8208 entries, and requires somewhat more than 32 kB to store each of these (usually) four byte entries. This implementation, as it can use exact values for all possible entries, introduces very little error, at the cost of a significant use of memory.

The second implementation uses a much smaller lookup table, e.g., 256 entries and 1 kB of memory. For values of x larger than those that appear in the lookup table, linear interpolation is used to approximate values. This approach requires much less memory usage, but requires several expensive hardware elements.

Figure 2A:
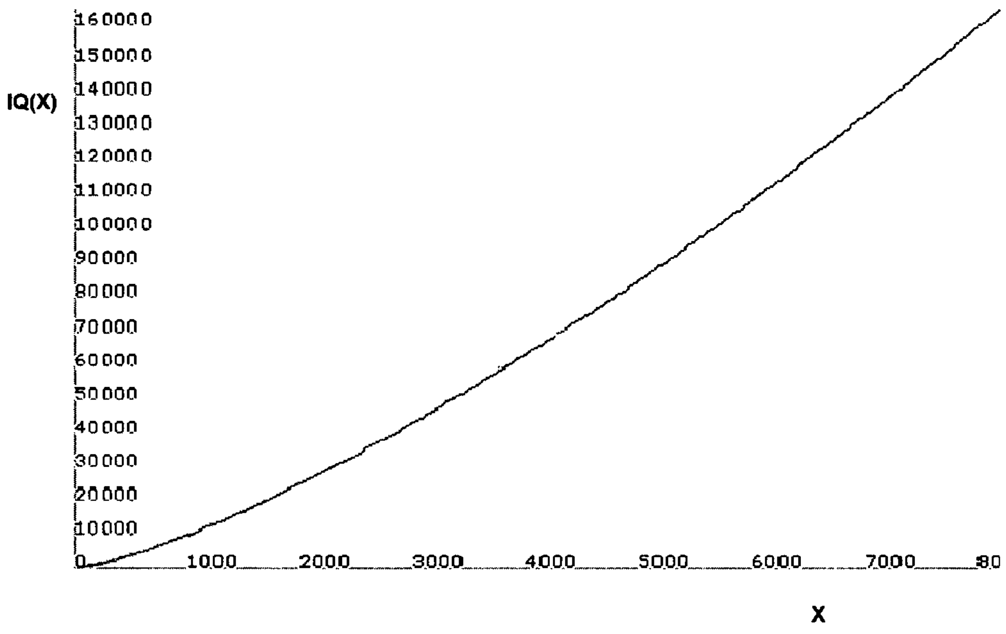
FIG. 2A is a graph of $IQ=x^{4/3}$, in accordance with one embodiment of the present invention.
Figure 2B:
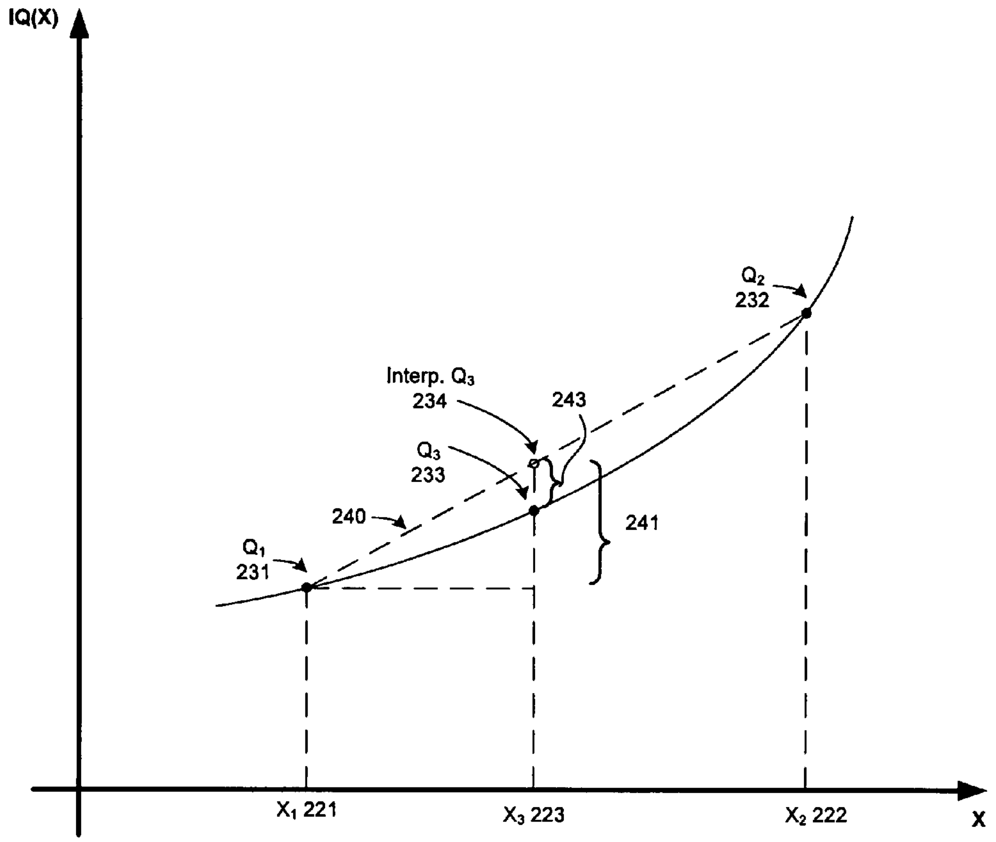
FIG. 2B is a graph of $IQ=x^{4/3}$, with a limited range of x, in accordance with one embodiment of the present invention.

With reference now FIGS. 2A and 2B, graphical representations of the inverse quantization equation for AAC and MP3 is provided. These graphical representations are not to scale. FIG. 2A depicts graph 200, a graph of $IQ=x^{4/3}$, where x ranges from 0 to 8207, and IQ ranges from 0 to approximately 165500 ($8207^{4/3}$). FIG. 2B focuses on a portion of this range, where x ranges from $x_1$ to $x_2$, and IQ ranges from a corresponding $Q_1$ to $Q_2$.

FIG. 2B depicts the calculation of an inverse quantized value, $Q_3$ 233, using linear interpolation. Using two known values, $Q_1$ 231 and $Q_2$ 232, and their corresponding x coordinates, $x_1$ 221 and $x_2$ 222, the slope of the line 240 between $Q_1$ 231 and $Q_2$ 232 can be determined. From this slope, and $x_3$ 223, an interpolation distance, or interpolation value, 241 can be determined; interpolation distance 241 and $Q_1$ 231 can then be used to calculate an approximate, or interpolated, $Q_3$ 234. The error introduced by linear interpolation is shown as the distance between $Q_3$ 233 and approximate $Q_3$ 234, indicated here as offset 243.

When calculating inverse quantization for some value $x_3$, e.g., $x_3$ 223, using this second approach, if $x_3$ is larger than the lookup table available, then this implementation requires determining several different values. This determination represents a significant investment of resources, as it is necessary to implement a multistage branching operation in hardware.

A second hardware investment is required to in order to implement the calculation of the slope between the two reference points, e.g., the slope of line 240. In some embodiment, this calculation is implemented using a 25-bit by 6-bit multiplier. This implementation also requires a 32-bit by 30-bit multiplier, used to reduce precision from the lookup table, and extract the integer portion of the data.

Efficient Inverse Quantization

Described herein are embodiments which perform nonlinear inverse quantization, within an acceptable margin of error, while requiring fewer resources than the present implementations. For example, in one embodiment, an approach to providing nonlinear inverse quantization for the AAC and MP3 standards is described, which substantially avoids the need for multiple branchings, and eliminates the requirement for the second, large, hardware multiplier.

Also described herein are embodiments which reduce the errors introduced by linear interpolation. In several such embodiments, a small offset table is utilized to correct for the errors introduced by linear interpolation of nonlinear inverse quantization data.

Further, described herein are embodiments which combine reduced hardware requirements for calculating nonlinear inverse quantization data, with the reduction in errors introduced by linear interpolation.

Performing Inverse Quantization

Figure 3A:
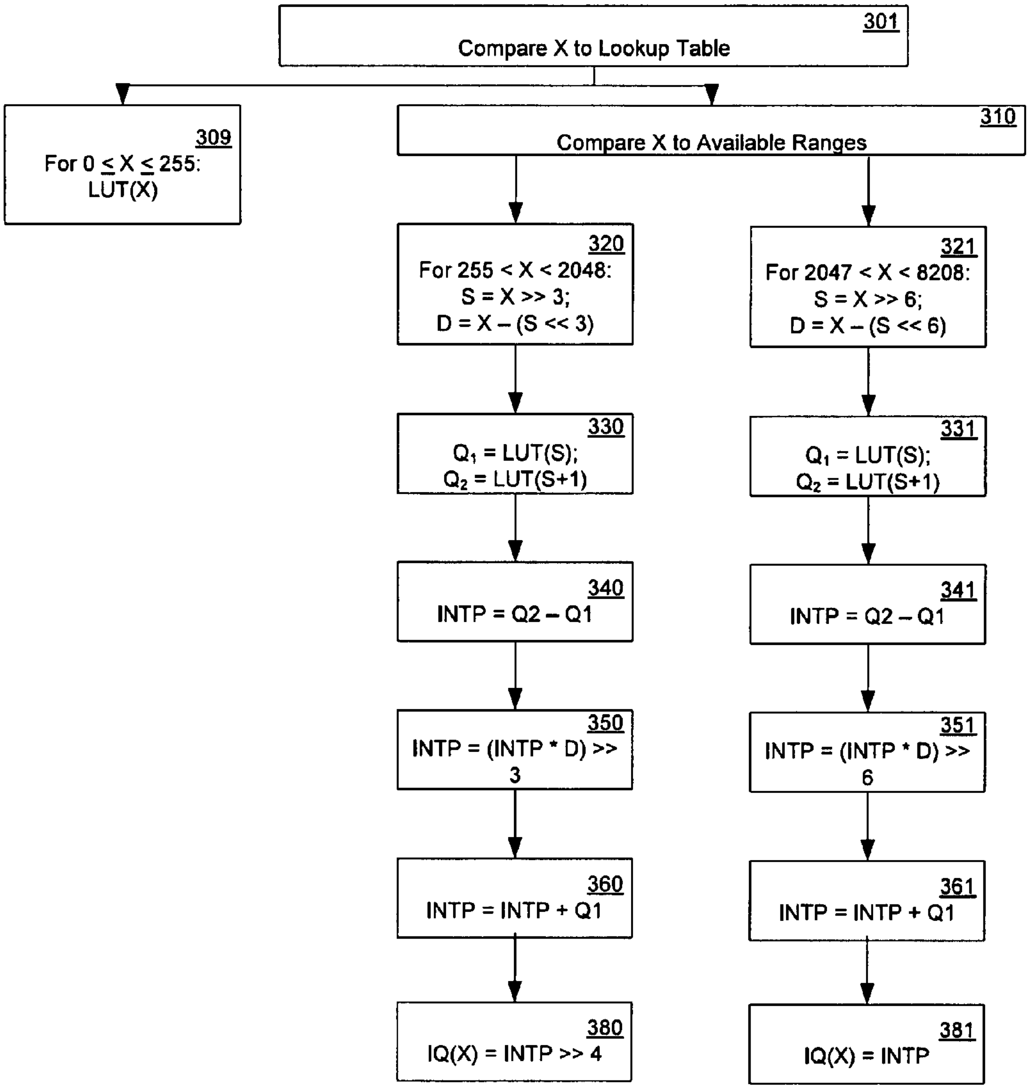
FIG. 3A is a flowchart of an exemplary method of performing inverse quantization, in accordance with one embodiment.

With reference now to FIG. 3A, a flowchart 300 of a method of performing inverse quantization is depicted, in accordance with one embodiment. Although specific steps are disclosed in flowchart 300, such steps are exemplary. That is, embodiments of the present invention are well suited to performing various other (additional) steps or variations of the steps recited in flowchart 300. It is appreciated that the steps in flowchart 300 may be performed in an order different than presented, and that not all of the steps in flowchart 300 may be performed. Further, it is understood that embodiments which implement the method of flowchart 300 may implement this method using software, hardware, or some combination of both approaches.

As shown in FIG. 3, flowchart 300 depicts the inverse quantization of some value, X. In the depicted embodiment, the inverse quantization method utilized conforms to the AAC and MP3 standard. Accordingly, X may range from 0 to a maximum of 8207. In other embodiments, the specific values and ranges utilized below may vary, in accordance with the specifications of different standards; in those embodiments, appropriate values may be selected and appropriate functions performed.

Initially, in step 301, the method of flowchart 300 differentiates between values of X which are present on the lookup table, and those that are not. For example, if the lookup table has a total of 256 entries, the method may differentiate between values of X which are between 0 and 255, and those which are greater than 255. If the value appears on the lookup table, the method continues to step 309. If the value does not appear on the lookup table, the method continues to step 310.

In step 309, the method retrieves the appropriate data from the lookup table, and finishes.

In step 310, the method further differentiates between two possible ranges of values for X. In the depicted embodiment, if X is less than 2048, the method continues to step 320. If not, the method continues to step 321. This value was selected, in the depicted embodiment, to divide the possible range between the two preset bit-shifting operations which occur in steps 320 and 321.

In step 320, two values are calculated: S and D. S is set to X, the value, bit-shifted right by 3 bits. For X values between 256 and 2047, such a shift ensures that S falls between 0 and 255. D is selected, such that X=D+(S<<3); that is, D is the difference between the original X value, and S after it has been bit-shifted back to X's original precision. For example, with reference to FIG. 2B, D is the distance between $x_3$ 223 and $x_1$ 221.

With reference to steps 330 through 360, the slope of the linear function between $Q_1$ and $Q_2$ is determined, and used to calculate an approximate $Q_3$.

In step 330, the lookup table is referenced for S, and for S+1. This produces two values, $Q_1$ and $Q_2$. In step 340, the difference between $Q_2$ and $Q_1$ is determined. In step 350, the difference between $Q_2$ and $Q_1$ is multiplied by D, and divided by $2^3$. In step 360, the resulting value is added to $Q_1$, to generate an approximate $Q_3$. In this embodiment, these steps are equivalent to the two equations presented in Table 2.

TABLE 2

$$\mathrm{INTP} = \frac{(Q_2 - Q_1)}{(x_2 - x_1)} * (x_3 - x_1)$$

$$\text{Approx } Q_3 = \mathrm{INTP} + Q_1$$

For example, using FIG. 2B, ($Q_2$ 232–$Q_1$ 231) divided by ($x_2$ 222–$x_1$ 221) would yield the slope of line 240. Multiplying that slope by ($x_3$ 223–$x_1$ 221) gives interpolation distance 241; adding interpolation distance 241 to $Q_1$ provides approximate $Q_3$ 234.

With reference to step 380, the approximate $Q_3$ value calculated above is bit-shifted right 4 places. In the depicted embodiment, this bit-shift operation is selected, in conjunction with the original bit-shift operation performed in step 320, to perform the exponential operation called for by the standard, namely $X^{4/3}$.

As regards steps 321, 331, 341, 351, 361, and 381, similar functionality is utilized for the case where X>2407. Instead of beginning with a 3-bit shift, however, a 6-bit shift is used.

In step 321, two values are calculated: S and D. S is set to X, the value, bit-shifted right by 6 bits. For X values between 2048 and 8207, such a shift ensures that S falls between 0 and 255. D is selected, such that X=D+(S<<6); that is, D is the difference between the original X value, and S after it has been bit-shifted back to X's original precision. For example, with reference to FIG. 2B, D is the distance between $x_3$ 223 and $x_1$ 221.

With reference to steps 331, 341, 351, and 361, the slope of the linear function between $Q_1$ and $Q_2$ is determined, and used to calculate an approximate $Q_3$.

In step 331, the lookup table is referenced for S, and for S+1. This produces two values, $Q_1$ and $Q_2$. In step 341, the difference between $Q_2$ and $Q_1$ is determined. In step 351, the difference between $Q_2$ and $Q_1$ is multiplied by D, and divided by $2^6$. In step 361, the resulting value is added to $Q_1$, to generate an approximate $Q_3$. In this embodiment, these steps are equivalent to the two equations presented in Table 2.

With reference to step 381, the approximate $Q_3$ value calculated above is the calculated IQ of X. In effect, the bit-shifting operations which occurred in the preceding steps were equivalent to the required exponential function, $X^{4/3}$.

Figure 3B:
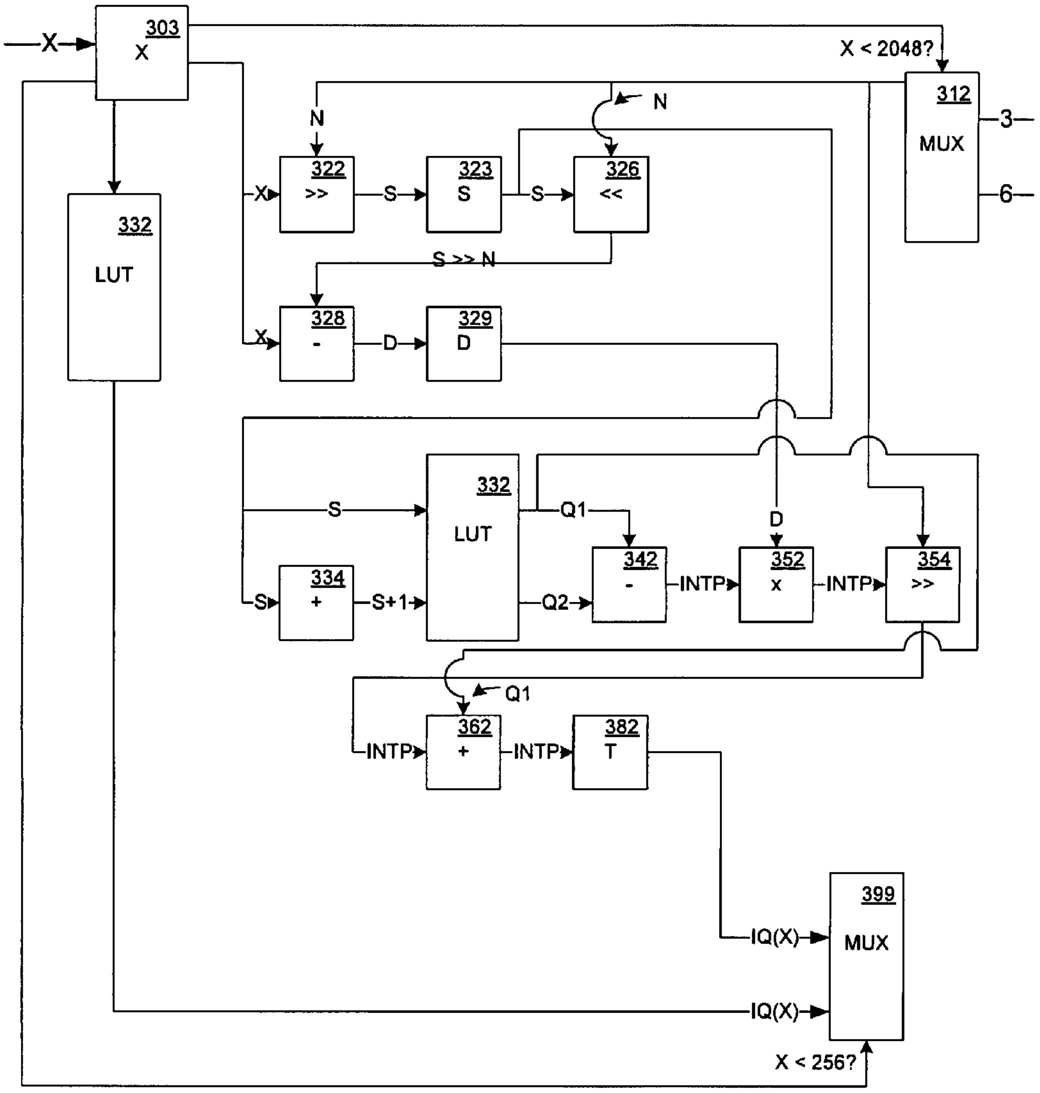
FIG. 3B is a block diagram of a system for performing inverse quantization, in accordance with one embodiment.

With reference now to FIG. 3B, a block diagram of a system 302 for performing inverse quantization is depicted, in accordance with one embodiment. While system 302 is shown as including specific, enumerated features, it is understood that embodiments are well-suited to applications involving addition, fewer, or different elements and/or features. In particular, it is understood that embodiments may utilize alternative hardware components to implement specific functionality.

In the depicted embodiment, system 302 shows an exemplary hardware implementation of the inverse quantization method described by flowchart 300. Initially, a value X is received by system 302, and stored, e.g., in a register 303. In some embodiments, other means for storing may be utilized; e.g., a flip-flop may be used to latch the value X, rather than storing it in a register. Similarly, other values stored in system 302 maybe stored in any convenient manner, in different embodiments.

As shown in FIG. 3B, X is passed to a MUX 312; MUX 312, in the depicted embodiment, is used to select between potential shift operators, N, e.g., between bit-shifting 3 or 6 bits. If X is less than 2048, N=3 is used; if X is greater than or equal to 2048, N=6 is used. As shown, X is passed to a shifter 322, and is shifted N bits, e.g., either 3 or 6, as indicated by MUX 312. The output of shifter 322, S, is then stored in register 323.

In the depicted embodiment, S is passed to another shifter, shifter 326, which left-shifts S by N bits. This shifted value is then passed to subtraction module 328, and is subtracted from the initial X value to produce D. D is stored in register 329.

As shown, S is passed to lookup table 332, to produce value Q1. S is also passed to an adder, to produce S+1, which is similarly passed to lookup table 332, producing value Q2. Q1 is subtracted from Q2 by subtraction module 342. The resulting value is passed to multiplier module 352, where it is multiplied by D. That product is then right-shifted N bits by shifter 354. This value is added to Q1, and then passed to truncation module 382. The output of truncation module 382 is IQ(X).

In the depicted embodiment, X is also passed directly to lookup table 332. This path is utilized for values of X which appear on the lookup table, e.g., where X is less than 256. MUX 399 uses X to select between these two functional paths, as appropriate.

Linear Interpolation Error

Figure 4A:
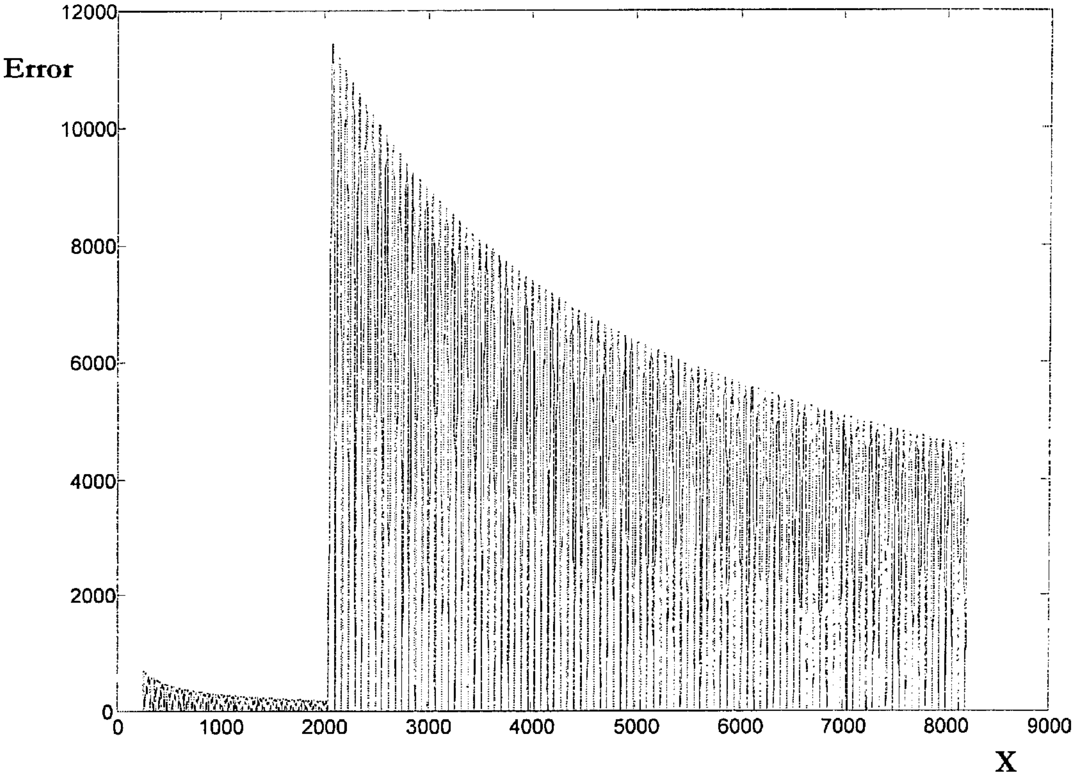
FIG. 4A is a graph of the error in decoding caused by linear interpolation, in accordance with one embodiment.

With reference now to FIG. 4A, a graph 400 of the error in decoding caused by this method is presented, in accordance with one embodiment. Error, as used herein, is a measure of the difference between the mathematically correct value of IQ(X), and the IQ interpolated (X) calculated using the method of Flowchart 300. For example, $257^{4/3}$, using floating point number calculation, the 13-bit fixed point result should be 13385485. Using the method described in flowchart 300, the result is 13385799. Accordingly, the error is 314.

In the depicted graph, X values run from 0 to 8207, with error ranging from 0 to nearly 12000. These results are sufficient for this embodiment to pass compliance tests for the AAC and MP3 formats.

As depicted in FIG. 4A, error is divided into 3 sections: $0 \le X \le 255$, $256 \le X \le 2047$, and $2048 \le X \le 8207$. Error in the first range is effectively zero, as the lookup table contains precise entries for each of these values. Error in the second interval is non-zero, but relatively small, as the errors introduced by linear interpolation are still fairly small in this range. Error in the third interval is greater, but still within the limits enforced by the AAC and MP3 standards.

Figure 4B:
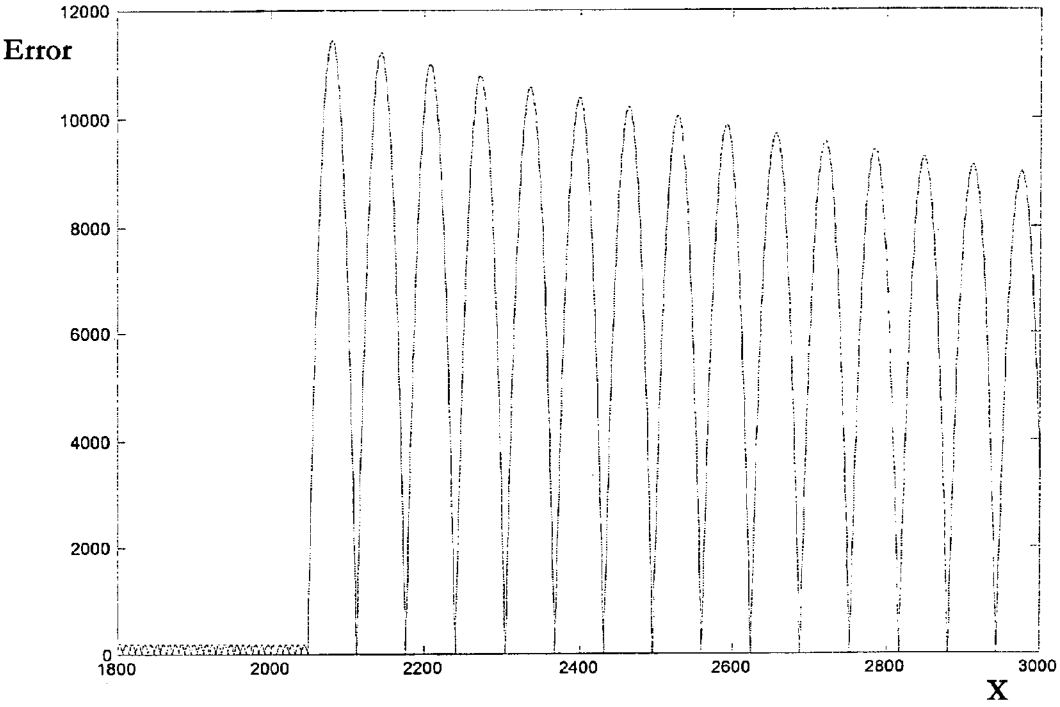
FIG. 4B is a graph of the error in decoding caused by linear interpolation, over a limited range of x, in accordance with one embodiment.

With reference now to FIG. 4B, a graph 450, a portion of graph 400, is depicted, in accordance with one embodiment. Graph 450 shows the error over the interval of $1800 \le X \le 3000$.

As noted previously, and as illustrated by offset 243, using linear interpolation for nonlinear quantization introduces an additional error. In some embodiments, this linear interpolation error can be reduced by the use of an offset table. The offset table is generated, using a number of reference point spread across the entirety of the range of possible values. These offset values can then be used, e.g., added in, when calculating the approximate inverse quantization value.

Offset Table Generation

Figure 5:
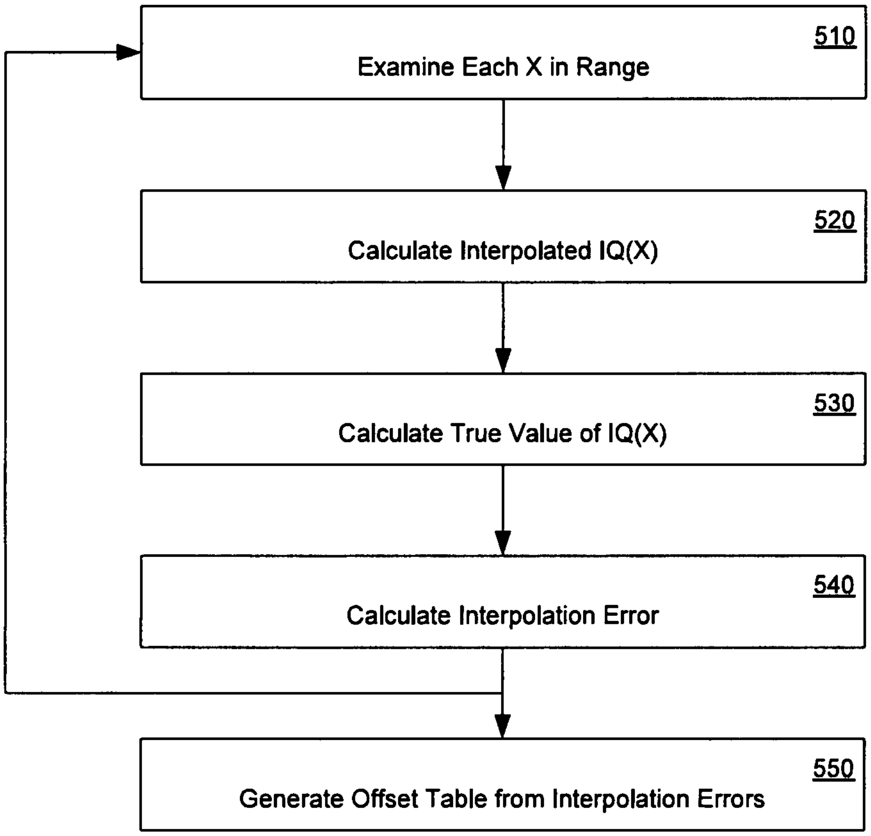
FIG. 5 is a flowchart of an exemplary method of generating an offset table for use with linear interpolation, in accordance with one embodiment.

Described below, with reference to FIG. 5, is a method that can be used for generating such an offset table. While the discussion that follows focuses on applications to the MP3 and AAC standards, is understood that embodiments are well suited for use with many different applications of linear interpolation.

With reference to FIG. 5, a flowchart 500 of a method of generating an offset table for use with linear interpolation is depicted, in accordance with one embodiment. Although specific steps are disclosed in flowchart 500, such steps are exemplary. That is, embodiments of the present invention are well suited to performing various other (additional) steps or variations of the steps recited in flowchart 500. It is appreciated that the steps in flowchart 500 may be performed in an order different than presented, and that not all of the steps in flowchart 500 may be performed. Further, it is understood that embodiments which implement the method of flowchart 500 may implement this method using software, hardware, or some combination of both approaches.

With reference now to step 510, the method initially examines each possible value of X in a given range. In some embodiment, e.g., for the AAC and MP3 standards, it may be desirable to only examine a portion of the possible range of values of X. Specifically, in one embodiment, the range from 2048 to 8207 is examined; within this range, the value of D will vary from zero to 63. Moreover, the size of the offset table which will be generated may vary across different embodiments. In one embodiment, where the standard being implemented is for the AAC and MP3 formats, an offset table having 64 entries is convenient, as it allows one entry per possible value of D. It is understood that different embodiments are well-suited for applications with offset tables of differing sizes. In some embodiments, the use of any offset table will decrease interpolation error; in several such embodiments, the larger the offset table used, the greater the improvement in performance.

With reference to step 520, the interpolated value for the inverse quantization of the current value of X is calculated. Which method is used to calculate this interpolated value will vary, across different embodiments. In one embodiment, the method set forth in flowchart 300 may be utilized.

With reference now to step 530, the true value of the inverse quantization for the current value of X is calculated. In one embodiment, this step entails using the actual equations provided by a given standard, in order to calculate the mathematically precise value of the inverse quantization for the current value of X. For example, when implementing the AAC and MP3 formats, the equation provided in Table 1 is utilized, in order to determine the exact value of the inverse quantization of a given value of X.

With reference now to step 540, the interpolation error is calculated, using the difference between the interpolated value and the true value for the current value of X. Step 540 allows for the computation of the exact error, within precision, between the interpolated value and the true value for the inverse quantization of a particular value of X.

In some embodiments, steps 520 to 540 are repeated for some or all of the possible values of X in the given range.

With reference now to step 550, the offset table is generated, with interpolation correction values derived from the calculated differences between the interpolated and true values. In different embodiments, different approaches will be utilized. In one embodiment, for example, where the AAC and MP3 formats are to be implemented, a 64 entry offset table is used, to provide one offset value for each possible value of D. In this embodiment, the average of the minimum interpolation error and the maximum interpolation error for a given value of D across the entire range from 2048 to 8207 is calculated, and used as an interpolation correction value for that value of D. In other embodiment, the size of the offset table may vary, and the approach used to generate an interpolation correction value may also very.

Figure 6:
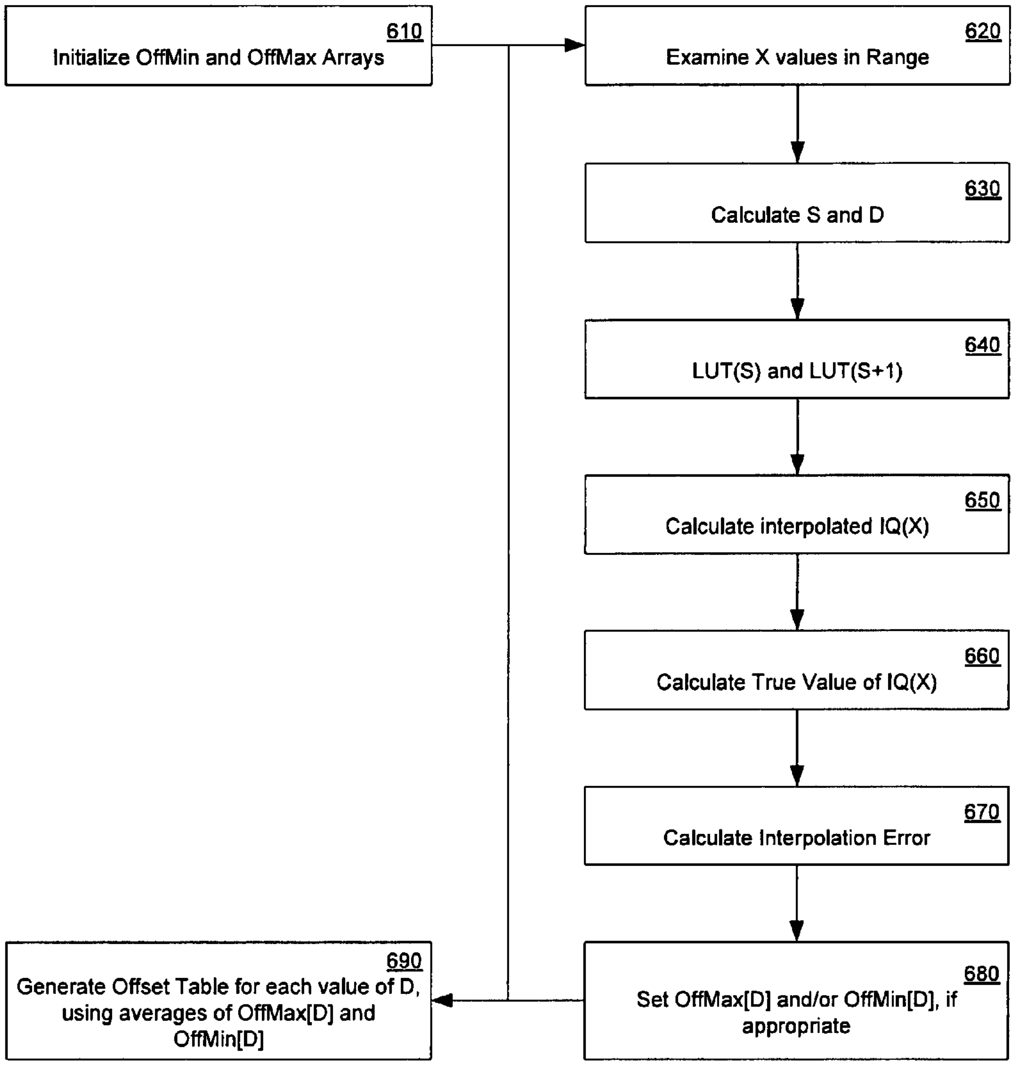
FIG. 6 is a flowchart of an exemplary method of generating an offset table for use with the AAC and MP3 formats, in accordance with one embodiment.

With reference to FIG. 6, a flowchart 600 of a method of generating an offset table for use with the AAC and MP3 formats is depicted, in accordance with one embodiment. Although specific steps are disclosed in flowchart 600, such steps are exemplary. That is, embodiments of the present invention are well suited to performing various other (additional) steps or variations of the steps recited in flowchart 600. It is appreciated that the steps in flowchart 600 may be performed in an order different than presented, and that not all of the steps in flowchart 600 may be performed. Further, it is understood that embodiments which implement the method of flowchart 600 may implement this method using software, hardware, or some combination of both approaches.

With reference first to step 610, two 64 entry arrays are initialized. In the depicted embodiment, one array, the offset minimum array, is initialized to maximum values, while the other, the offset maximum array, is initialized to minimum values.

With reference to step 620, the range of possible X values from 2048 to 8207 is examined.

With reference to steps 630 through 650, the interpolated value of the inverse quantization of X is calculated. In step 630, two values are calculated: S and D. S is set to X, the value, bit-shifted right by 6 bits. For X values between 2048 and 8207, such a shift ensures that S falls between 0 and 255. D is selected, such that X=D+(S<<6); that is, D is the difference between the original X value, and S after it has been bit-shifted back to X's original precision. For example, with reference to FIG. 2B, D is the distance between $x_3$ 223 and $x_1$ 221.

In step 640, the lookup table is referenced for S, and for S+1. This produces two values, $Q_1$ and $Q_2$. In step 650, the difference between $Q_2$ and $Q_1$ is determined, multiplied by D, and divided by $2^6$. The resulting value is added to $Q_1$, to generate the interpolated value of the inverse quantization of X. In this embodiment, these steps are equivalent to the two equations presented in Table 2.

With reference to step 660, the true value of the inverse quantization of X is calculated, using the equation provided in Table 1.

With reference to step 670, the interpolation error between the interpolated value and the true value of the inverse quantization of X is calculated.

With reference to step 680, if the interpolation error is greater than the currently stored maximum interpolation error for this value of D, the interpolation error is stored in the offset maximum array. If the interpolation error is less than the currently stored minimum interpolation error for this value of D, the interpolation error is stored in the offset minimum array.

In the depicted embodiment, steps 620 through 680 are repeated for all values of X within the defined range. In this manner, the maximum and minimum interpolation errors for the entire range for each value of D are stored in the two arrays.

In step 690, an average interpolation error is calculated for each value of D, by adding the minimum and maximum interpolation errors for a particular value of D, and dividing by two. The average interpolation errors are used to populate a 64 entry offset table.

As noted above, it is understood that embodiments are well-suited to applications wherever linear interpolation is utilized. In some embodiments, linear interpolation is utilized where inverse quantization is called for, e.g., for the AAC and MP3 formats.

Inverse Quantization with Offset

Figure 7:
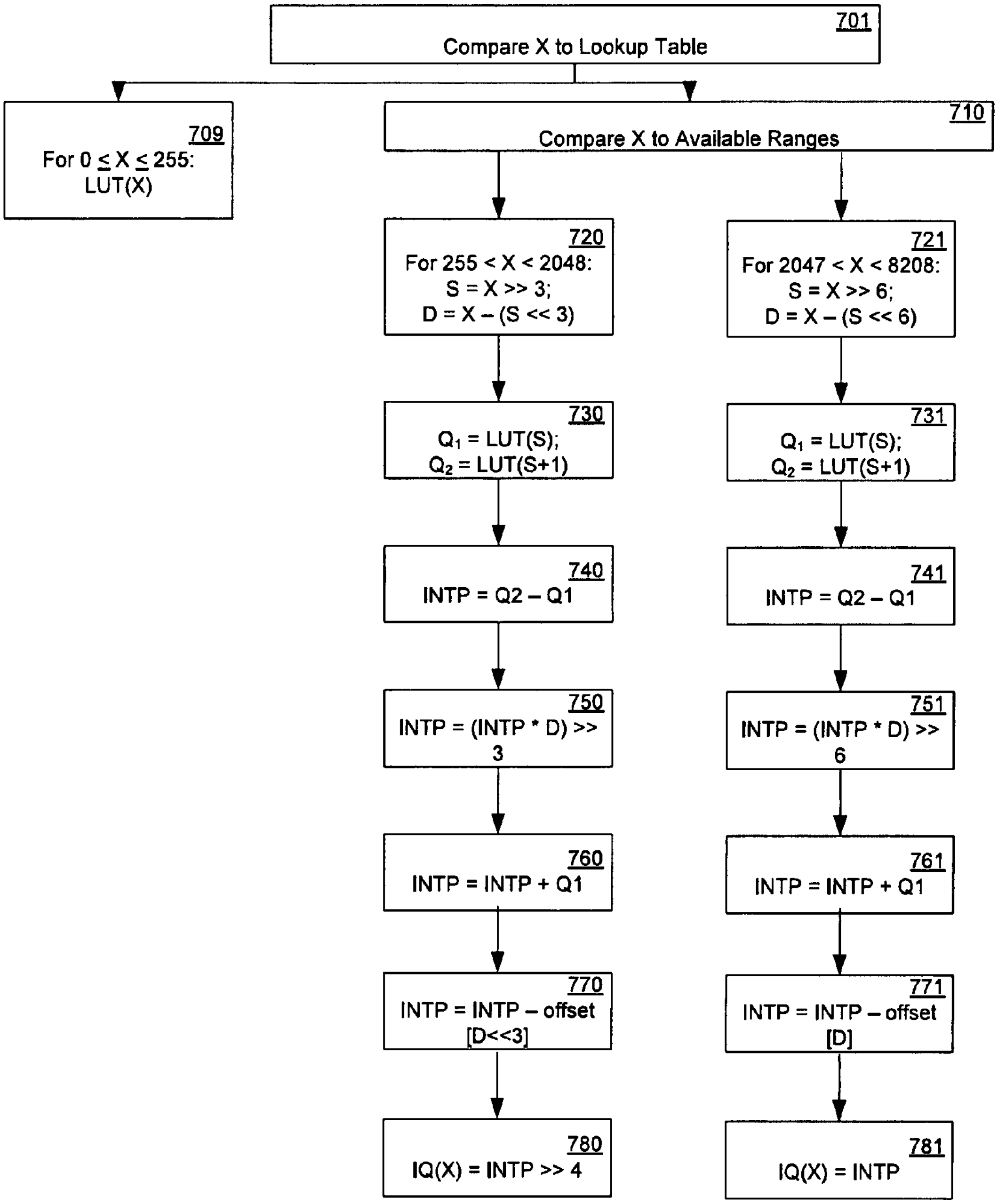
FIG. 7 is a flowchart of an exemplary method of calculating an inverse quantization value, in accordance with one embodiment.

With reference now to FIG. 7, a flowchart 700 of a method of calculating an inverse quantization value is depicted, in accordance with one embodiment. Although specific steps are disclosed in flowchart 700, such steps are exemplary. That is, embodiments of the present invention are well suited to performing various other (additional) steps or variations of the steps recited in flowchart 700. It is appreciated that the steps in flowchart 700 may be performed in an order different than presented, and that not all of the steps in flowchart 700 may be performed. Further, it is understood that embodiments which implement the method of flowchart 700 may implement this method using software, hardware, or some combination of both approaches.

As shown in FIG. 7, flowchart 700 depicts the inverse quantization of some value, X. The method described by flowchart 700 is similar to that presented by FIG. 3, with the addition of the use of an offset table, to reduce the errors introduced by linear interpolation. In the depicted embodiment, the inverse quantization method utilized conforms to the AAC and MP3 standard. Accordingly, X may range from 0 to a maximum of 8207. A 64 entry offset table is utilized, derived using the method described in flowchart 600. In other embodiments, the specific values and ranges utilized below may vary, in accordance with the specifications of different standards; in those embodiments, appropriate values may be selected and appropriate functions performed.

Initially, in step 701, the method of flowchart 700 differentiates between values of X which are present on the lookup table, and those that are not. For example, if the lookup table has a total of 256 entries, the method may differentiate between values of X which are between 0 and 255, and those which are greater than 255. If the value appears on the lookup table, the method continues to step 709. If the value does not appear on the lookup table, the method continues to step 710.

In step 709, the method retrieves the appropriate data from the lookup table, and finishes.

In step 710, the method further differentiates between two possible ranges of values for X. In the depicted embodiment, if X is less than 2048, the method continues to step 720. If not, the method continues to step 721. This value was selected, in the depicted embodiment, to divide the possible range between the two preset bit-shifting operations which occur in steps 720 and 721.

In step 720, two values are calculated: S and D. S is set to X, the value, bit-shifted right by 3 bits. For X values between 256 and 2047, such a shift ensures that S falls between 0 and 255. D is selected, such that X=D+(S<<3); that is, D is the difference between the original X value, and S after it has been bit-shifted back to X's original precision. For example, with reference to FIG. 2B, D is the distance between $x_3$ 223 and $x_1$ 221.

With reference to steps 730 through 760, the slope of the linear function between $Q_1$ and $Q_2$ is determined, and used to calculate an interpolated $Q_3$.

In step 730, the lookup table is referenced for S, and for S+1. This produces two values, $Q_1$ and $Q_2$. In step 740, the difference between $Q_2$ and $Q_1$ is determined. In step 750, the difference between $Q_2$ and $Q_1$ is multiplied by D, and divided by $2^3$. In step 760, the resulting value is added to $Q_1$, to generate an interpolated $Q_3$. In this embodiment, these steps are equivalent to the two equations presented above, in Table 2.

For example, using FIG. 2B, ($Q_2$ 232−$Q_1$ 231) divided by ($x_2$ 222−$x_1$ 221) would yield the slope of line 240. Multiplying that slope by ($x_3$ 223−$x_1$ 221) gives interpolation distance 241; adding interpolation distance 241 to $Q_1$ provides approximate $Q_3$ 234.

With reference to step 770, an offset table is referenced for the value of D, and the resulting interpolation correction value is subtracted from the interpolated $Q_3$.

With reference to step 780, the corrected $Q_3$ value calculated above is bit-shifted right 4 places. In the depicted embodiment, this bit-shift operation is selected, in conjunction with the original bit-shift operation performed in step 720, to perform the exponential operation called for by the standard, namely $X^{4/3}$.

As regards steps 721, 731, 741, 751, 761, 771, and 781, similar functionality is utilized for the case where X>2407. Instead of beginning with a 3-bit shift, however, a 6-bit shift is used.

In step 721, two values are calculated: S and D. S is set to X, the value, bit-shifted right by 6 bits. For X values between 2048 and 8207, such a shift ensures that S falls between 0 and 255. D is selected, such that X=D+(S<<6); that is, D is the difference between the original X value, and S after it has been bit-shifted back to X's original precision. For example, with reference to FIG. 2B, D is the distance between $x_3$ 223 and $x_1$ 221.

With reference to steps 731, 741, 751, and 761, the slope of the linear function between $Q_1$ and $Q_2$ is determined, and used to calculate an approximate $Q_3$.

In step 731, the lookup table is referenced for S, and for S+1. This produces two values, $Q_1$ and $Q_2$. In step 741, the difference between $Q_2$ and $Q_1$ is determined. In step 751, the difference between $Q_2$ and $Q_1$ is multiplied by D, and divided by $2^6$. In step 761, the resulting value is added to $Q_1$, to generate an approximate $Q_3$. In this embodiment, these steps are equivalent to the two equations presented in Table 2.

With reference to step 771, an offset table is referenced for the value of D, and the resulting interpolation correction value is subtracted from the interpolated $Q_3$.

With reference to step 781, the corrected Q value calculated above is the calculated IQ of X.

As with the method of flowchart 300 and system 302, above, many hardware implementations of the method of flowchart 700 are utilized, in different embodiments. In one embodiment, system 302 is modified to incorporate an offset table, e.g., by subtracting an appropriate interpolation correction value, retrieved from an offset table, from the calculated interpolated value.

Corrected Linear Interpolation Error

Figure 8A:
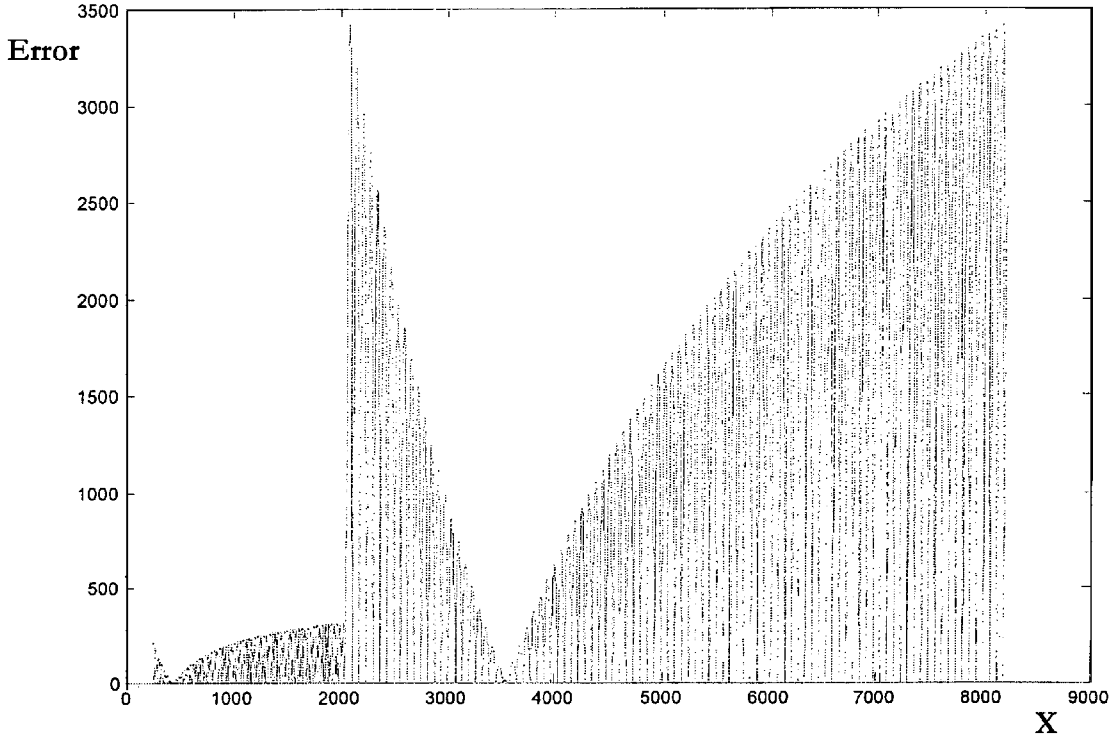
FIG. 8A is a graph of the error in decoding caused by linear interpolation, as modified by use of an offset table, in accordance with one embodiment.

With reference now to FIG. 8A, a graph 800 of the error in decoding caused by linear interpolation, corrected through the use of an offset table is presented, in accordance with one embodiment. Error, as used herein, is a measure of the difference between the mathematically correct value (the true value) of IQ(X), and the IQ(X) calculated using the method of flowchart 700.

In the depicted graph, X values run from 0 to 8207, with error ranging from 0 to nearly 3500. These results are sufficient for this embodiment to pass compliance tests for the AAC and MP3 formats.

As depicted in FIG. 4B, error is divided into 3 sections: 0≤X≤255, 256≤X≤2047, and 2048≤X≤8207. Error in the first range is effectively zero, as the lookup table contains precise entries for each of these values. Error in the second interval is non-zero, but relatively small; the use of an offset table reduces the errors in this region, as compared to the error introduced by the method of flowchart 300. Error in the third interval is greater, but again is substantially reduced as compared to the method of flowchart 300, and well within the compliance limits enforced by the AAC and MP3 standards. Use of a 64 entry, 128 byte offset table greatly reduces interpolation error.

Figure 8B:
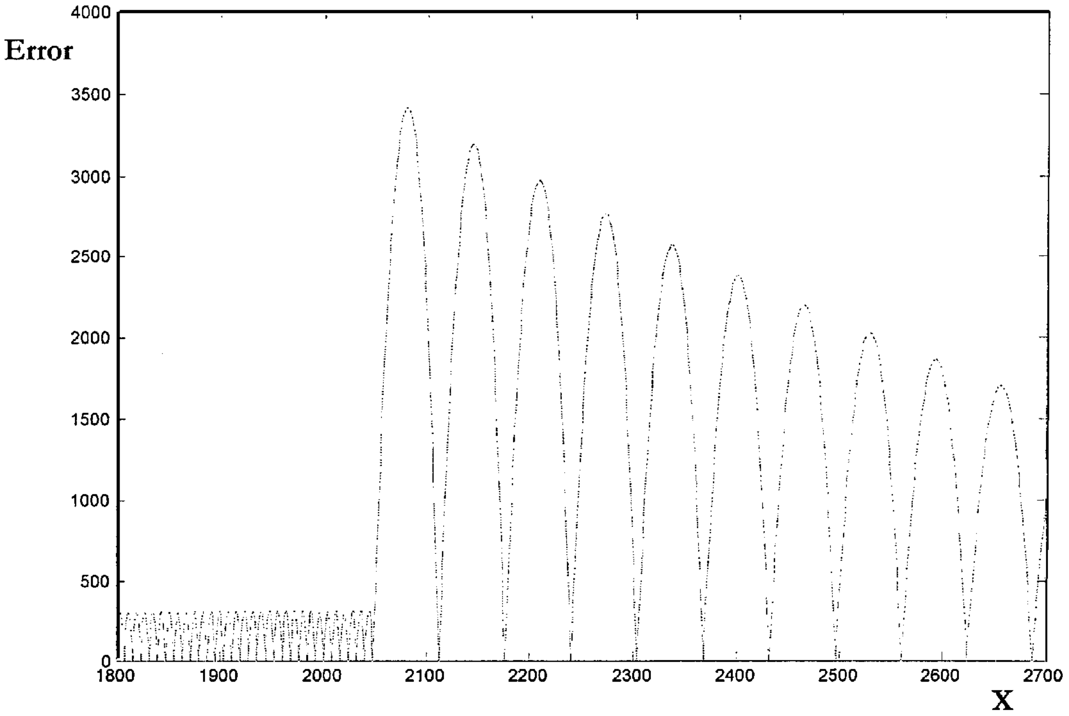
FIG. 8B is a graph of the error in decoding caused by linear interpolation, as modified by use of an offset table, over a limited range of x, in accordance with one embodiment.

With reference now to FIG. 8B, a graph 850, a portion of graph 800, is depicted, in accordance with one embodiment. Graph 850 shows the error over the interval of 1800≤X≤2700.

Reducing Interpolation Error Through the Use of an Offset Table

As described above, an offset table can be generated and utilized, in some embodiments, to reduce the error introduced by linear interpolation. In different embodiments, different approaches can be utilized for performing inverse quantization. Further, in different embodiments, linear interpolation may be utilized for different purposes. The use of the offset table also extends to many different embodiments in which different kinds of interpolation are used. For example, in one embodiment, the offset table is utilized to correct for errors introduced by spline interpolation, or polynomial interpolation.

In some embodiments, the value of the offset table is to allow multiple values to be grouped, with a single corresponding offset correction value. This allows a memory savings over, e.g., providing offset correction values for every possible value, while still reducing the error introduced by interpolation. For example, a single offset correction value may be applied to a range of values. For a single value within that range, the offset correction value may eliminate interpolation error; for the remaining values in the range, error will be substantially reduced, as opposed to not using the offset correction value.

Figure 9:
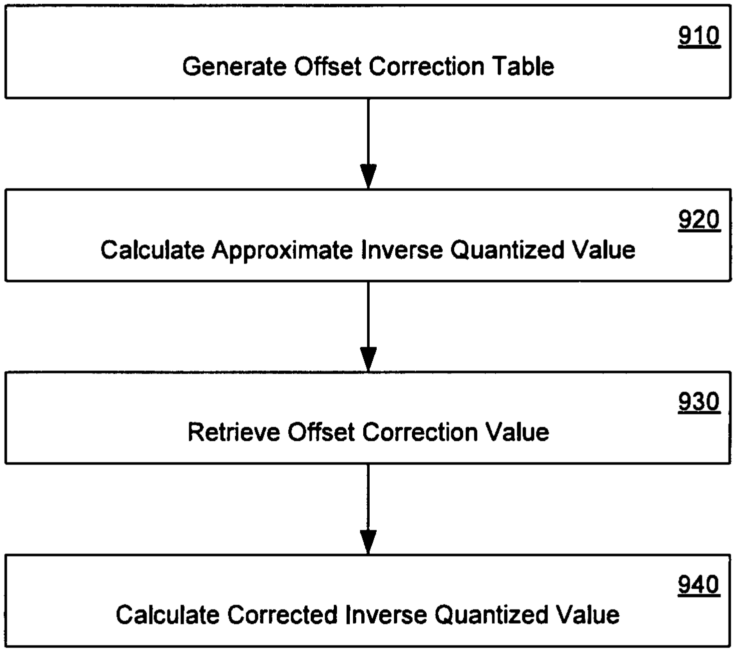
FIG. 9 is a flowchart of a method of reducing linear interpolation error, in accordance with one embodiment.

With reference now to FIG. 9, a flowchart 900 of a method of reducing linear interpolation error is depicted, in accordance with one embodiment. Although specific steps are disclosed in flowchart 900, such steps are exemplary. That is, embodiments of the present invention are well suited to performing various other (additional) steps or variations of the steps recited in flowchart 900. It is appreciated that the steps in flowchart 900 may be performed in an order different than presented, and that not all of the steps in flowchart 900 may be performed. Further, it is understood that embodiments which implement the method of flowchart 900 may implement this method using software, hardware, or some combination of both approaches.

In step 910, an offset correction table is generated. In different embodiments, the contents of this offset correction table may vary. Further, in different embodiments, different approaches to generating the offset table may be utilized. For example, the approaches described in flowchart 500 and flowchart 600 may be utilized, where appropriate.

In step 920, in the depicted embodiment, an approximate inverse quantized value is calculated. While the depicted embodiment describes inverse quantization, it is understood that this usage is exemplary only. As noted above, embodiments are not limited to inverse quantization, and include applications involving other utilizations of linear interpolation.

With reference to step 930, an offset correction value is retrieved from the offset correction table. In different embodiments, different approaches may be utilized in retrieving the offset correction value. For example, with reference to FIG. 7, the value D is used to retrieve an offset correction value, as D corresponds to the portion of the initial value not used in calculating the approximate inverse quantized value. In other embodiments, other approaches are utilized.

With reference to step 940, a corrected inverse quantized value is calculated, from the approximate inverse quantized value and the offset correction value. In different embodiments, different approaches may be followed for calculating a corrected value. For example, with reference to FIG. 7, the offset correction value is subtracted from the approximate inverse quantized value.

System for Calculating an Inverse Quantized Value

Figure 10:
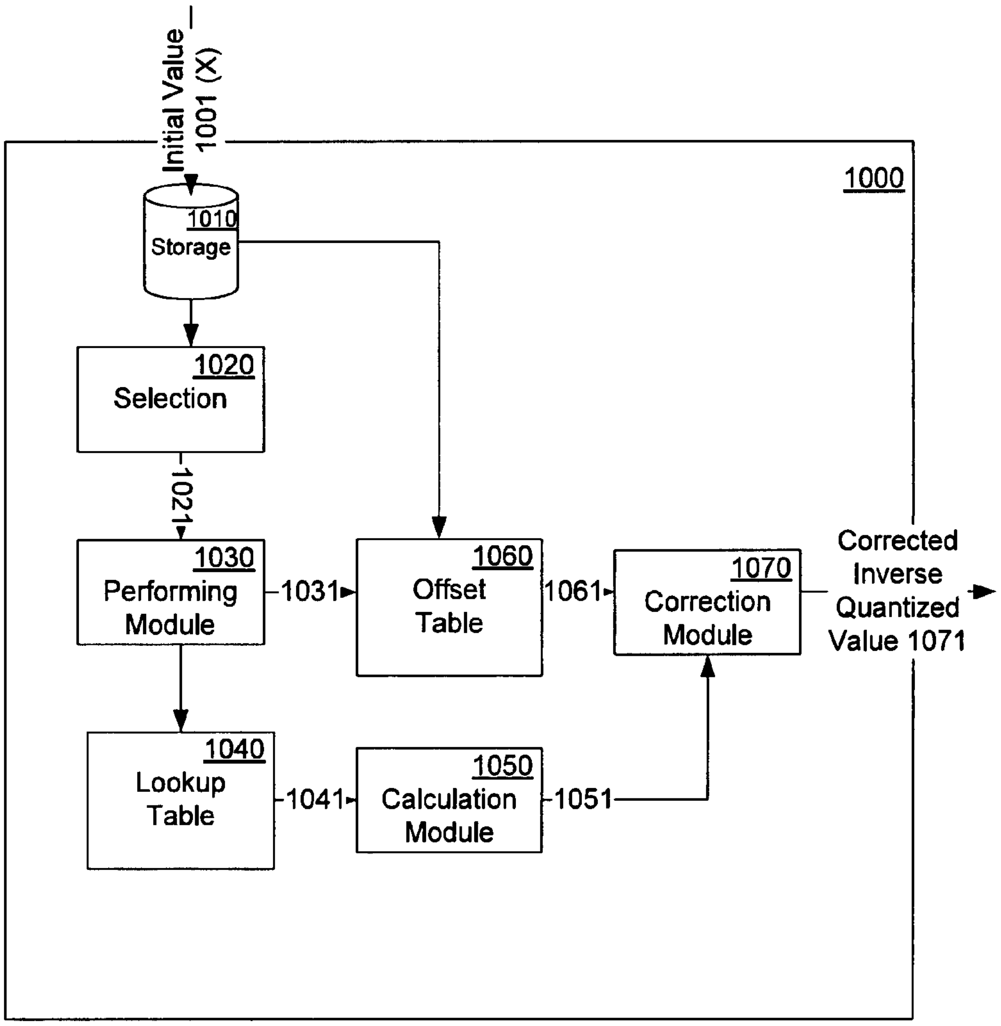
FIG. 10 is a block diagram of a system for calculating an inverse quantized value, in accordance with one embodiment.

With reference to FIG. 10, a system 1000 for calculating an inverse quantized value is depicted, in accordance with one embodiment. While system 1000 is depicted as having specific, enumerated features, elements, and arrangements, it is understood that embodiments are well suited to applications involving different, fewer, or additional elements or features, or alternative arrangements of features or elements.

System 1000, as shown, receives an initial value 1001 (X), and stores it in a storage means 1010. In different embodiments, different storage means 1010 are utilized. For example, in one embodiment, storage means 1010 comprises a register.

System 1000 also includes a selection means 1020. In the depicted embodiment, selection means 1020 is used for selecting between multiple operations to perform on initial value 1001. In different embodiments, the nature of the operation being selected may vary. For example, in one embodiment, selection means 1020 chooses between two bit shifting operations to be performed on the initial value 1010. Further, the nature of selection means 1020 may vary, across different embodiments. For example, in one embodiment, selection means 1020 comprises a MUX.

System 1000 includes performing means 1030. As shown, performing means 1030 uses the selected operation, selected operation 1021, and performs it on initial value 1001. The nature of performing means 1030 may vary, across different embodiments. For example, performing means 1030 may comprise a shifter, in an embodiment where selected operation 1021 comprises a shift operation.

System 1000 is shown as incorporating lookup table 1040. In the depicted embodiment, lookup table 1040 receives modified value 1031 from performing means 1030, and retrieves several quantized values based on modified value 1031. In other embodiments, lookup table 1040 may be used in other ways, or to store and retrieve different information.

System 1000 includes calculation means 1050. As shown, calculation means 1050 receives retrieved values from lookup table 1040, e.g., several quantized values 1041. Calculation means 1050 uses the values retrieved by lookup table 1040 to calculate an approximate inverse quantized value 1051. In different embodiments, calculation means 1050 operates in different ways. For example, in one embodiment, calculation means 1050 may use the system and method described in FIGS. 3A and 3B.

As shown, system 1000 includes offset table 1060. In the depicted embodiment, offset table 1060 is used to help reduce linear interpolation error. As shown, offset table 1060 receives modified value 1031 and initial value 1001. From these values, offset table 1060 can retrieve offset correction value 1061. In other embodiments, other approaches are utilized for calculating an offset correction value.

System 1000 is also depicted as including correction module 1070. In the depicted embodiment, correction module

1070 receives approximate inverse quantized value 1051 and offset correction value 1061, and uses these values to produce a corrected inverse quantized value 1071. In different embodiments, correction module 1070 operates in different ways. For example, in some embodiments, correction module 1070 may subtract offset correction value 1061 from approximate inverse quantized value 1051.

Embodiments of the present invention are thus described. While the present invention has been described in particular embodiments, it should be appreciated that the present invention should not be construed as limited by such embodiments, but rather construed according to the following claims.

The invention claimed is:

1. A method of reducing linear interpolation error, comprising:

calculating, within an electronic system, an approximate inverse quantized value wherein said calculating is performed by a processor;

accessing an offset correction table; and calculating a corrected inverse quantized value based on said offset correction table and said approximate inverse quantized value.

2. The method of claim 1, wherein said accessing comprises retrieving an offset correction value.

3. The method of claim 2, wherein said offset correction value corresponds to said approximate inverse quantized value.

4. The method of claim 2, wherein said calculating comprises modifying said approximate inverse quantized value with reference to said offset correction value to produce said corrected inverse quantized value.

5. The method of claim 1, further comprising:

generating an offset correction table.

6. The method of claim 1, wherein said approximate inverse quantized value is calculated in accordance with a digital media standard.

7. The method of claim 6, wherein said digital media standard is compliant with an MP3 standard.

8. The method of claim 6, wherein said digital media standard is compliant with an Advanced Audio Coding (AAC) standard.

9. The method of claim 1, wherein said calculating said approximate inverse quantized value comprises:

determining whether a quantized integral value is within a first range of possible values or a second range of possible values; and calculating said approximate inverse quantized value from said quantized integral value, said calculating comprising bit shifting said quantized integral value a predetermined number of bits, said predetermined number of bits associated with said first range of possible values or said second range of possible values.

10. An article of manufacture including a non-transitory computer-readable storage medium having instructions stored thereon that, if executed by a computing device, cause the computing device to perform a method of reducing linear interpolation error comprising:

calculating an approximate inverse quantized value;

accessing an offset correction table; and calculating a corrected inverse quantized value based on said offset correction table and said approximate inverse quantized value.

11. The article of manufacture of claim 10, wherein said accessing comprises retrieving an offset correction value.

12. The article of manufacture of claim 11, wherein said offset correction value corresponds to said approximate inverse quantized value.

13. The article of manufacture of claim 11, wherein said calculating comprises modifying said approximate inverse quantized value with reference to said offset correction value to produce said corrected inverse quantized value.

14. The article of manufacture of claim 10, wherein said method comprises:

generating an offset correction table.

15. The article of manufacture of claim 10, wherein said approximate inverse quantized value is calculated in accordance with a digital media standard.

16. The article of manufacture of claim 15, wherein said digital media standard is compliant with an MP3 standard.

17. The article of manufacture of claim 15, wherein said digital media standard is compliant with an Advanced Audio Coding (AAC) standard.

18. The article of manufacture of claim 10, wherein said calculating said approximate inverse quantized value comprises:

determining whether a quantized integral value is within a first range of possible values or a second range of possible values; and calculating said approximate inverse quantized value from said quantized integral value, said calculating comprising bit shifting said quantized integral value a predetermined number of bits, said predetermined number of bits associated with said first range of possible values or said second range of possible values.

19. A system for reducing linear interpolation error, comprising:

a system for calculating an approximate inverse quantized value;

wherein said system accesses an offset correction table; and wherein said system for calculates a corrected inverse quantized value based on said offset correction table and said approximate inverse quantized value.

20. The system of claim 19, further comprising:

wherein said system generates an offset correction table.

* * * * *